US012753791B2

(12) United States Patent
Zeng et al.

(10) Patent No.: US 12,753,791 B2
(45) Date of Patent: Oct. 6, 2026

(54) HINGE MECHANISM AND ELECTRONIC DEVICE

(71) Applicant: VIVO MOBILE COMMUNICATION CO., LTD., Dongguan (CN)

(72) Inventors: Wenhui Zeng, Dongguan (CN); Yibo Guo, Dongguan (CN)

(73) Assignee: VIVO MOBILE COMMUNICATION CO., LTD., Dongguan (CN)

( * ) Notice: Subject to any disclaimer, the term of this patent is extended or adjusted under 35 U.S.C. 154(b) by 109 days.

(21) Appl. No.: 18/914,438

(22) Filed: Oct. 14, 2024

(65) Prior Publication Data

US 2025/0035150 A1 Jan. 30, 2025

Related U.S. Application Data

(63) Continuation of application No. PCT/CN2023/088490, filed on Apr. 14, 2023.

(30) Foreign Application Priority Data

Apr. 15, 2022 (CN) ......................... 202210395788.5

(51) Int. Cl.
*F16C 11/04* (2006.01)
*H05K 5/02* (2006.01)

(52) U.S. Cl.
CPC ............ *F16C 11/04* (2013.01); *H05K 5/0226* (2013.01)

(58) Field of Classification Search
None
See application file for complete search history.

(56) References Cited

U.S. PATENT DOCUMENTS

| | | | | |
|---|---|---|---|---|
| 2018/0146560 | A1* | 5/2018 | Chen | G02F 1/133308 |
| 2021/0410305 | A1 | 12/2021 | Feng | |
| 2024/0040021 | A1* | 2/2024 | Yao | H04M 1/022 |
| 2024/0259487 | A1* | 8/2024 | Sun | G06F 1/1616 |

FOREIGN PATENT DOCUMENTS

| | | | |
|---|---|---|---|
| CN | 110285180 | A | 9/2019 |
| CN | 112995368 | A | 6/2021 |
| CN | 113194183 | A | 7/2021 |
| CN | 113202857 | A | 8/2021 |

(Continued)

*Primary Examiner* — James Wu
*Assistant Examiner* — Christopher L Augustin
(74) *Attorney, Agent, or Firm* — The Webb Law Firm

(57) ABSTRACT

A hinge mechanism includes a base, first rotating components, second rotating components, a first connecting component, a second connecting component, a floating support component, and elastic reset members. In a case that the hinge mechanism is in a first state, at least one of the plurality of the second rotating components supports the floating support component, and the elastic reset members are in a stretched or compressed state. A distance between an outer wall of the base facing away from a rotation axis of the first rotating component and the floating support component is a first distance. In a case that the hinge mechanism is in a second state, the second rotating components avoid the floating support component, a distance between the outer wall of the base and the floating support component is a second distance, and the second distance is less than the first distance.

14 Claims, 5 Drawing Sheets

(56) References Cited

FOREIGN PATENT DOCUMENTS

| | | | |
|---|---|---|---|
| CN | 113790211 | A | 12/2021 |
| CN | 215773187 | A | 2/2022 |
| CN | 114135567 | A | 3/2022 |
| CN | 215928109 | U | 3/2022 |
| CN | 114658749 | A | 6/2022 |
| WO | 2020138988 | A1 | 7/2020 |

* cited by examiner

HINGE MECHANISM AND ELECTRONIC DEVICE

CROSS-REFERENCE TO RELATED APPLICATIONS

This application is a Bypass Continuation Application of International Patent Application No. PCT/CN2023/088490 filed Apr. 14, 2023, and claims priority to Chinese Patent Application No. 202210395788.5 filed Apr. 15, 2022, the disclosures of which are hereby incorporated by reference in their entireties.

BACKGROUND OF THE INVENTION

Field of the Invention

This application belongs to the field of communication device technologies, and in particular, relates to a hinge mechanism and an electronic device.

Description of Related Art

To consider features such as portability and a large display area, foldable electronic devices are increasingly popular among consumers. Generally, a hinge mechanism is disposed in the foldable electronic device, and the hinge mechanism enables the foldable electronic device to have a folding capability. Currently, the foldable electronic devices are mostly in an outward fold structure. When such an electronic device is in a folded state, a display is located on the outside, which causes easy friction or collision between the display of the electronic device and an external object. This seriously shortens a service life of the display.

SUMMARY OF THE INVENTION

According to a first aspect, an embodiment of this application provides a hinge mechanism, including a base, first rotating components, second rotating components, a first connecting component, a second connecting component, a floating support component, and elastic reset members.

There are a plurality of first rotating components and a plurality of second rotating components, the plurality of first rotating components are disposed on the base, and the plurality of second rotating components are rotatably connected to the plurality of first rotating components in a one-to-one correspondence.

Both the first connecting component and the second connecting component are fixedly connected to screen support components of an electronic device, at least one of the plurality of second rotating components is fixedly connected to the first connecting component, and at least another one of the plurality of second rotating components is fixedly connected to the second connecting component.

The floating support component is disposed on a side that is of the base and that faces a screen support side of the base, and the floating support component is movably connected to the base along an arrangement direction of the floating support component and the base.

There are a plurality of elastic reset members, the elastic reset members are connected between the floating support component and the base, the plurality of elastic reset members include a first reset member and a second reset member, the first reset member is on one side of a midpoint of the base in a direction of a rotation axis of the first rotating component, the second reset member is on the other side of the midpoint of the base, and an angle between a connection line between the first reset member and the second reset member and the rotation axis is an acute angle.

The hinge mechanism has a first state and a second state. In a case that the hinge mechanism is in the first state, the first connecting component is on one side of the base, the second connecting component is on the other side of the base, at least one of the plurality of second rotating components supports the floating support component, the elastic reset members are in a stretched or compressed state to squeeze the floating support component and the second rotating components, and a distance between an outer wall that is of the base and that faces away from the rotation axis of the first rotating component and the floating support component is a first distance.

In a case that the hinge mechanism is in the second state, both the first connecting component and the second connecting component are on a side that is of the base and that faces the rotation axis of the first rotating component, the second rotating components avoid the floating support component, a distance between the outer wall of the base and the floating support component is a second distance, and the second distance is less than the first distance.

According to a second aspect, an embodiment of this application provides an electronic device, including a display, screen support components, and the hinge mechanism. Both the first connecting component and the second connecting component are connected to the screen support components, and the display is supported on the floating support component of the hinge mechanism and the screen support components.

BRIEF DESCRIPTION OF THE DRAWINGS

The accompanying drawings described herein are used to provide a understanding of this application, and form part of this application. Exemplary embodiments of this application and descriptions thereof are used to explain this application, and do not constitute any inappropriate limitation to this application. In the accompanying drawings.

DESCRIPTIONS OF REFERENCE NUMERALS

100—base

Figure 1:
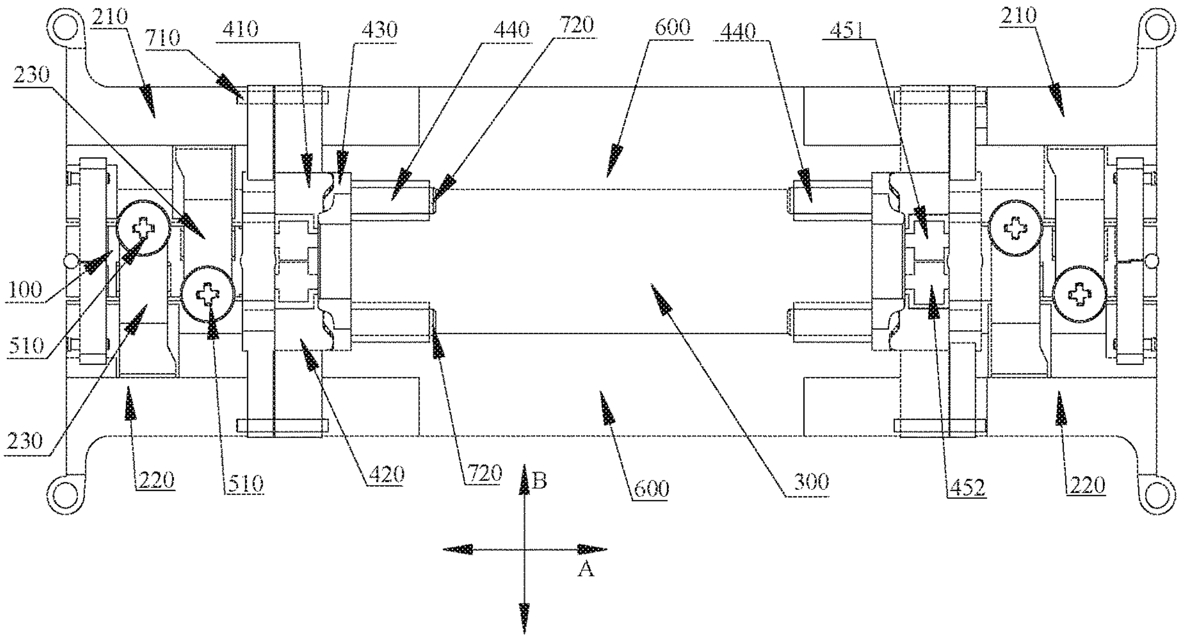
FIG. 1 is a schematic diagram of a structure of a hinge mechanism according to an embodiment of this application.

200—linkage member, 210—first connecting component, 220—second connecting component, 230—second rotating component, 231—guide groove, 240—sliding sleeve, 250—second hinge component, 260—first rotating component 300—floating support component
410—first synchronization swing arm, 420—second synchronization swing arm, 430—position limiting member, 440—damping component, 451—first gear, 452—second gear
510—abutment member, 520—elastic reset member
600—support plate
710—pin shaft, 720—link
800—display, 900—screen support component

DESCRIPTION OF THE INVENTION

The following clearly describes the technical solutions in embodiments of this application with reference to the accompanying drawings in embodiments of this application. Apparently, the described embodiments are some rather than all of embodiments of this application. All other embodiments obtained by a person of ordinary skill in the art based on embodiments of this application shall fall within the protection scope of this application.

The specification and claims of this application, and terms "first" and "second" are used to distinguish similar objects, but are unnecessarily used to describe a sequence or order. It is to be understood that data used in this way is interchangeable in a proper case, so that embodiments of this application described herein can be implemented in an order different from the order shown or described herein. The objects distinguished by "first", "second", and the like are usually of the same category, and a quantity of objects is not limited. For example, there may be one or more first objects. In addition, "and/or" used in this specification and the claims represents at least one of the connected objects, and the character "/" generally indicates an "or" relationship between the associated objects.

With reference to the accompanying drawings, the following describes in detail a hinge mechanism and an electronic device provided in embodiments of this application by using embodiments and application scenarios thereof.

As shown in FIG. 1 to FIG. 4, this embodiment of this application discloses a hinge mechanism. The hinge mechanism may be applied to an electronic device, so that the electronic device has a folding capability. The electronic device usually includes a display and screen support components. The screen support components are configured to provide an installation base for the display, and may provide support for the display. There are a plurality of screen support components, for example, two, three, or more screen support components. For case of understanding, the following uses the electronic device including two screen support components to describe a structure, a working status, and the like of the electronic device. A person skilled in the art may correspondingly expand an implementation with more screen support components according to a technical idea of this application. Details are not described herein.

The two screen support components are connected through the hinge mechanism, so that the two screen support components have a relative moving capability under the action of the hinge mechanism, and the electronic device can switch between a folded state and an unfolded state.

In a case that the electronic device is in the folded state, the two screen support components are stacked and disposed oppositely, and the display is located between the two screen support components. Certainly, the two screen support components may be parallel to each other, or there may be a small acute angle between the two screen support components.

In a case that the electronic device is in the unfolded state, a display surface of the display is a planar surface, and the two screen support components are also basically coplanar. Certainly, the display surface of the display in the unfolded state may not be an absolute planar structure, and there may be some bending, deformation, and the like in some positions on the display surface of the display. In this case, it may also be considered that the display (or the electronic device) is in the unfolded state.

As described above, in a use process of the electronic device, the display may be deformed with relative moving of the screen support components, and then at least a part of the display is a flexible structure. For example, the display may include a first display part, a second display part, and a third display part, and the first display part and the second display part are connected through the third display part, so that the three are connected as a whole. Optionally, the first display part and the second display part are hard screens, to lengthen service lives of the first display part and the second display part. The third display part is a flexible screen, and a position of the third display part corresponds to a position of the hinge mechanism, to ensure that the third display part does not hinder normal bending and unfolding actions of the hinge mechanism. In another embodiment of this application, the display may be a flexible screen as a whole. This may also ensure that the display has a capability to deform with actions of the hinge mechanism, can also improve consistency of the display, and improve a display effect of the display.

As shown in FIG. 1 to FIG. 4, the hinge mechanism disclosed in this embodiment of this application includes a base 100, first rotating components, second rotating components 230, a first connecting component 210, a second connecting component 220, a floating support component 300, and elastic reset members 520.

Both the first connecting component 210 and the second connecting component 220 are fixedly connected to screen support components of an electronic device, so that adjacent screen support components in the electronic device can form a connection relationship with the hinge mechanism, and the adjacent screen support components can move relative to each other by using the hinge mechanism. For example, the first connecting component 210 and the second connecting component 220 each may form a fixed connection relationship with a corresponding screen support component by using a screw or the like. Actual structures and sizes of both the first connecting component 210 and the second connecting component 220 may be determined according to actual shapes and sizes of other components such as the screen support components in the electronic device. This is not limited herein.

Optionally, there is one first connecting component 210 and one second connecting component 220, and the first connecting component 210 and the second connecting component 220 are respectively located on opposite sides of the entire hinge mechanism, to connect to corresponding screen support components. In another embodiment of this application, optionally, as shown in FIG. 1, there may be a plurality of first connecting components 210 and a plurality of second connecting components 220. The plurality of first connecting components 210 are arranged on one side of the entire hinge mechanism, and the plurality of first connecting components 210 are arranged in a direction with a large size in the entire hinge mechanism. The direction may be a length direction of the hinge mechanism, or may be a direction of a rotation axis of the first rotating component (or a first synchronization swing arm 410) in the hinge mechanism, and the direction is a direction A in FIG. 1. Correspondingly, the plurality of second connecting components 220 are arranged on the other side of the entire hinge mechanism, and the plurality of second connecting components 220 are arranged along the length direction of the entire hinge mechanism. The plurality of first connecting components 210 and the plurality of second connecting components 220 are all fixedly connected to corresponding screen support components in the electronic device, to improve connection reliability and force stability between adjacent screen support components.

The base 100 is a base component of the entire hinge mechanism, and other structures in the hinge mechanism may be directly or indirectly installed on the base 100 to form connection relationships with the base 100. In addition, most components or structures in the hinge mechanism are symmetrically disposed. For example, there are a plurality of first rotating components, and the plurality of first rotating components are disposed on the base 100. After impact of factors such as a position is excluded, the plurality of first rotating components include two first rotating components arranged symmetrically in structure, one of the two first rotating components fits with the first connecting component 210, and the other fits with the second connecting component 220.

Similarly, there are also a plurality of second rotating components 230, and the plurality of second rotating components 230 fit with the plurality of first rotating components in a one-to-one correspondence. The plurality of second rotating components 230 include two second rotating components 230 that fit in a one-to-one correspondence with the two first rotating components that are symmetrical in structure to form a rotation connection relationship. One of the two second rotating components 230 is connected to the first connecting component 210, and the other is connected to the second connecting component 220.

As described above, the first rotating component and the second rotating component 230 fit with each other, to form a rotation fit relationship. For example, both of the first rotating component and the second rotating component 230 may be structural combinations such as arc-shaped structural members with rotation axes located outside the two. This can reduce sizes of the base 100 and the entire hinge mechanism, and reduce complexity of the base 100. In a case that the first rotating component and the second rotating component 230 use the foregoing structure, because the first rotating component is disposed on the base 100, the base 100 may be configured to provide a position limiting function for the second rotating component 230 in a direction perpendicular to the rotation axis, to ensure a stable rotation fit relationship between the second rotating component 230 and the first rotating component. The direction perpendicular to the rotation axis may be a direction perpendicular to a paper surface in FIG. 1.

Figure 4:
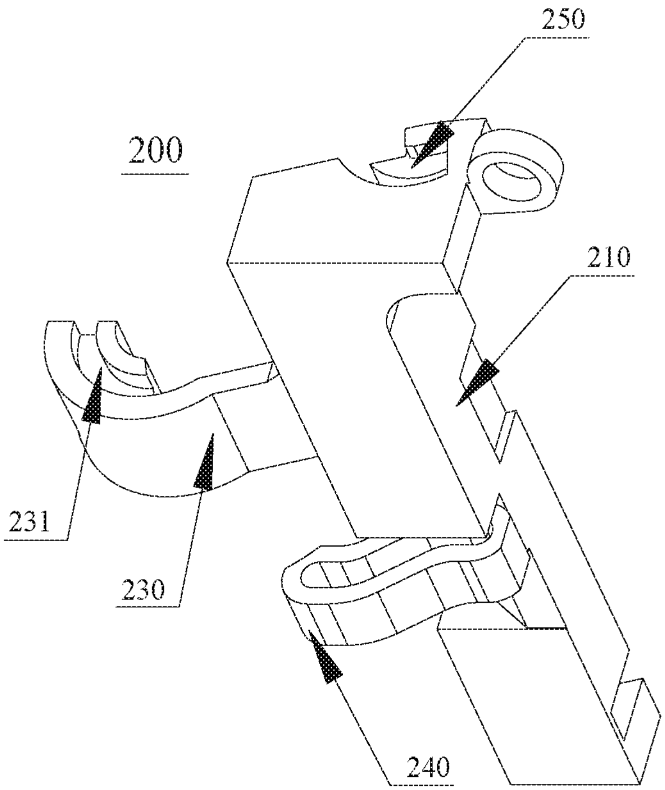
FIG. 4 is a schematic diagram of a structure of a linkage member in a hinge mechanism in another direction according to an embodiment of this application.
Figure 5:
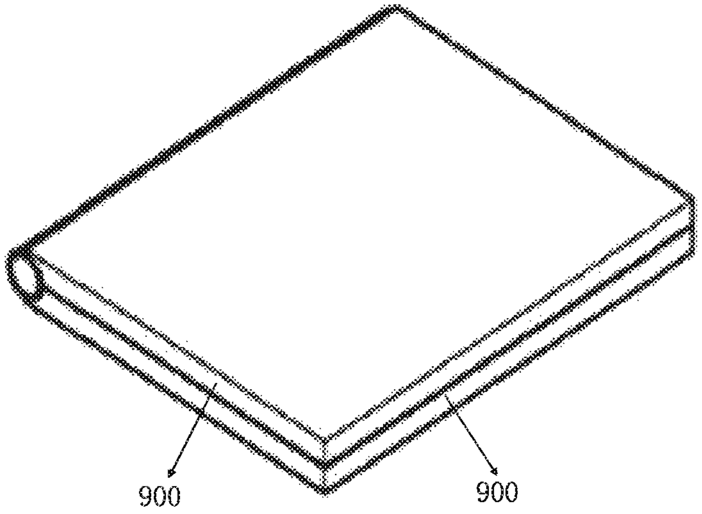
FIG. 5 is a schematic diagram of a structure of an electronic device according to an embodiment of this application.
Figure 6:
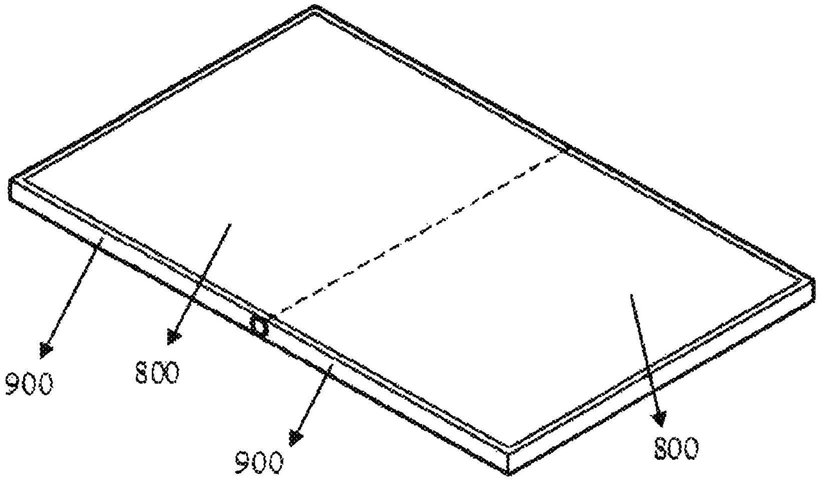
FIG. 6 is another schematic diagram of a structure of an electronic device according to an embodiment of this application.

In another embodiment of this application, a sinking groove may be disposed in the first rotating component, and the second rotating component 230 is slidably disposed in the sinking groove, so that the first rotating component and the second rotating component 230 form the rotation fit relationship. In addition, a guide rail may be disposed on an inner wall of the sinking groove, and an extension direction of the guide rail is the same as a motion track of the second rotating component 230 relative to the base 100. In addition, as shown in FIG. 4, a guide groove 231 is disposed on the second rotating component 230, and sliding fit between the guide rail and the guide groove 231 can ensure that the first rotating component and the second rotating component 230 can stably maintain a relative rotation state. Correspondingly, the guide rail and the guide groove 231 can stabilize a position limiting fit relationship between the first rotating component and the second rotating component 230 in the direction of the rotation axis of the first rotating component.

For example, the guide rail may be disposed on a side wall of the sinking groove of the first rotating component, that is, a surface that is of the sinking groove of the first rotating component and that is perpendicular to the rotation axis of the first rotating component. Based on this, the guide rail and the guide groove 231 can form a position limiting fit relationship in the direction perpendicular to the rotation axis of the first rotating component (that is, the direction perpendicular to the paper surface in FIG. 1). This can also ensure high stability of the rotation fit relationship between the first rotating component and the second rotating component 230.

As described above, at least one of the plurality of second rotating components 230 is connected to the first connecting component 210, to form a linkage relationship. At least another one of the plurality of second rotating components 230 is connected to the second connecting component 220, to form a linkage relationship. In addition, both the first connecting component 210 and the second connecting component 220 are connected to the screen support components of the electronic device, so that the base 100 can connect two adjacent screen support components together by using the first rotating component and the second rotating component 230 that are in the rotation fit, and when the first connecting component 210 and the second connecting component 220 move relative to each other, the corresponding second rotating components 230 can be driven to rotate relative to the first rotating components.

As described above, the hinge mechanism includes the floating support component 300. The floating support component 300 is disposed on a side that is of the base 100 and that faces a screen support side of the base 100. That is, the floating support component 300 is located on a side of the base 100. As described above, the base 100 is a basic part of the hinge mechanism, and is basically located in the middle of the hinge mechanism, so that the base 100 has a capability of providing support for the display, and the display is directly or indirectly supported on the base 100. The floating support component 300 is disposed on the screen support side of the base 100, so that the floating support component 300 can provide support for the display, to improve a supported effect of the display.

In addition, the floating support component 300 is movably connected to the base 100 along an arrangement direction of the floating support component 300 and the base 100, so that the floating support component 300 has a capability of moving closer to the base 100 or moving away from the base 100. The foregoing arrangement direction may be a direction perpendicular to the entire hinge mechanism when the hinge mechanism is in a first state, or a direction perpendicular to the display surface of the display in the unfolded state. More intuitively, the direction may be a direction perpendicular to the paper surface in FIG. 1.

Figure 2A:
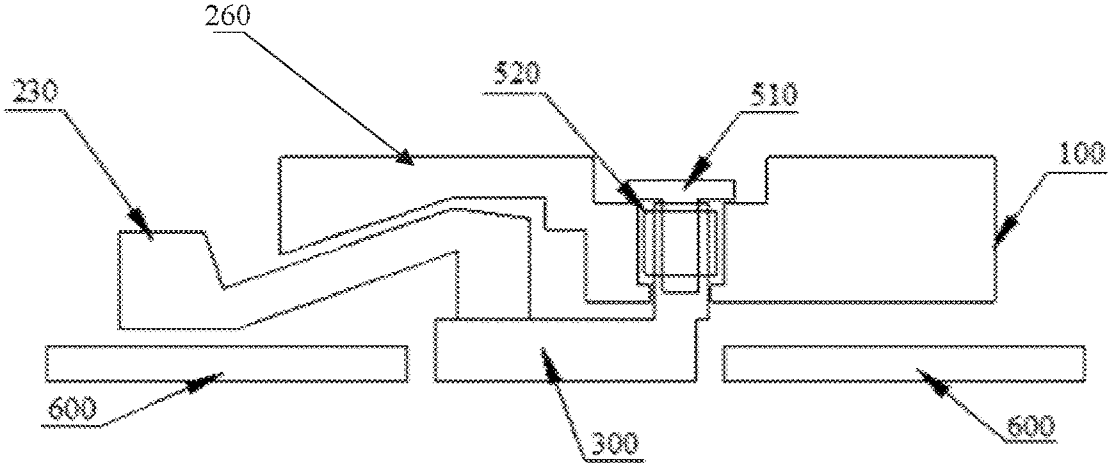
FIG. 2A is a schematic assembly diagram of an elastic reset member in a hinge mechanism according to an embodiment of this application.
Figure 2B:
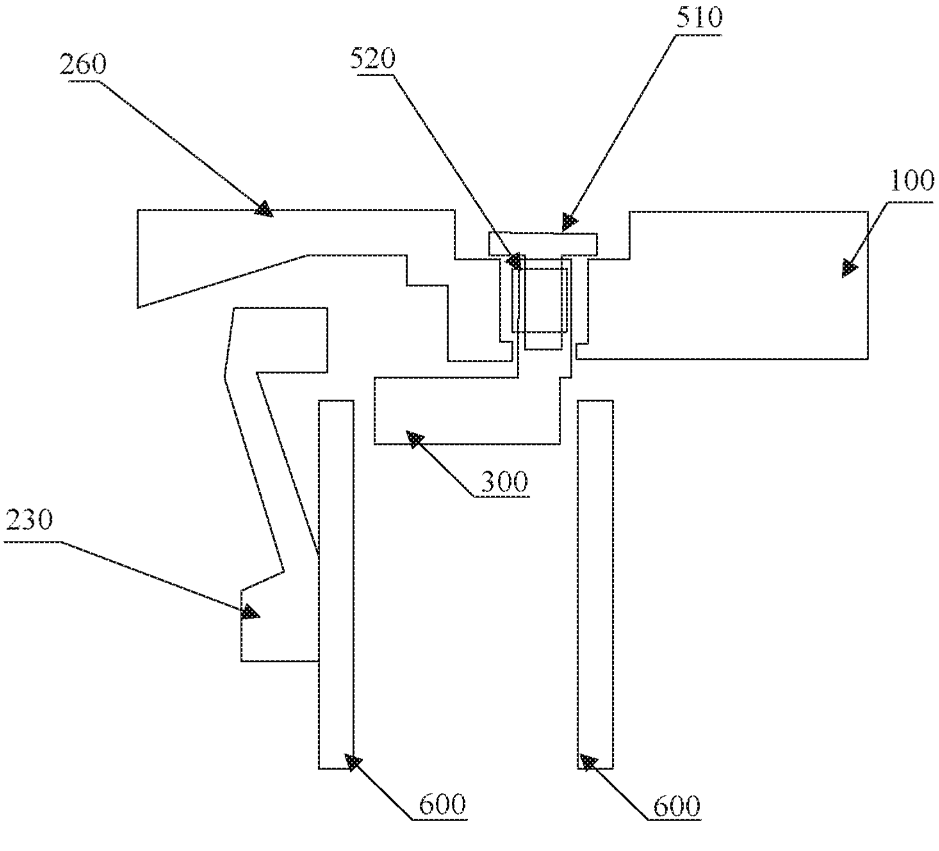
FIG. 2B is another schematic assembly diagram of an elastic reset member in a hinge mechanism according to an embodiment of this application.
Figure 3:
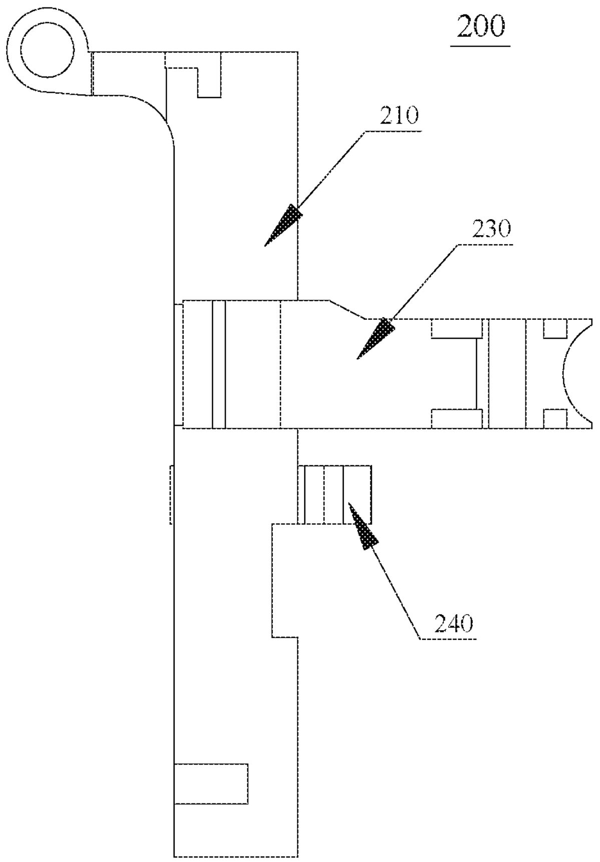
FIG. 3 is a schematic diagram of a structure of a linkage member in a hinge mechanism according to an embodiment of this application.

In the foregoing embodiment, the floating support component 300 that has a capability of moving relative to the base 100 is disposed, to provide an avoidance function for the display. In a case that the floating support component 300 is disposed in the hinge mechanism, as shown in FIG. 2, clastic reset members 520 may be disposed for the floating support component 300. That is, the hinge mechanism disclosed in this embodiment of this application may further include the elastic reset members 520. The clastic reset members 520 are connected between the floating support component 300 and the base 100, to provide a reset function for the floating support component 300 by using the elastic reset members 520.

To improve action stability of the floating support component 300, there are a plurality of elastic reset members 520, and the clastic reset members 520 are connected between the floating support component 300 and the base 100, so that the plurality of elastic reset members 520 can provide a reset function for the floating support component 300. In a process of disposing the plurality of elastic reset members 520, the plurality of elastic reset members 520 may be arranged along the direction of the rotation axis of the first rotating component.

In another embodiment of this application, the plurality of elastic reset members 520 are arranged in another arrangement manner that is different from the foregoing embodiment. For case of description, the plurality of elastic reset members 520 include a first reset member and a second reset member. That is, two of the plurality of elastic reset members 520 are the first reset member and the second reset member. The first reset member and the second reset member may be the same in structure and size, and positions of the first reset member and the second reset member relative to the base 100 are different.

Compared with the foregoing implementation in which the plurality of elastic reset members 520 are arranged along the direction of the rotation axis, in this embodiment, a connection line between at least two of the plurality of elastic reset members 520 may be arranged non-parallel to the rotation axis of the first rotating component.

For example, an angle between the connection line between the first reset member and the second reset member and the rotation axis may be an acute angle. In a case that the technical solution is used, because the first reset member and the second reset member are not arranged along the direction of the rotation axis, and both the first reset member and the second reset member are in surface contact with the floating support component 300, a size of a fitting area between each of the first reset member and the second reset member and the floating support component 300 can be enlarged to some extent, so that fitting stability between the first reset member and the second reset member and the floating support component 300 is higher, and deviation of the floating support component 300 is prevented during movement.

To improve force stability of the floating support component 300, optionally, the first reset member is located on one side of a midpoint of the base 100 in the direction of the rotation axis, and the second reset member is located on the other side of the midpoint of the base 100. Therefore, arrangement states of the first reset member and the second reset member relative to the floating support component 300 are more scattered, to improve stability of the support provided by the first reset member and the second reset member for the floating support component 300.

For example, a distance between the first reset member and the midpoint of the base 100 may be the same as or different from a distance between the second reset member and the midpoint of the base 100. In addition, a distance between the first reset member and the midpoint of the base 100 in a direction perpendicular to the rotation axis may also be the same as or different from a distance between the second reset member and the midpoint of the base 100 in the direction perpendicular to the rotation axis. A person skilled in the art may determine this according to structures of the first reset member and the second reset member. This is not limited herein. The direction perpendicular to the rotation axis may be a direction B in FIG. 1.

When the hinge mechanism in the structure works, there are at least two states: a first state and a second state. The first state corresponds to the unfolded state of the electronic device, and the second state corresponds to the folded state of the electronic device.

In a case that the hinge mechanism is in the first state, the first connecting component 210 is located on one side of the base 100, and the second connecting component 220 is located on the other side of the base 100, so that the hinge mechanism is in the unfolded state as a whole, to provide support for a middle part of the display, and also ensure that the screen support components connected through the hinge mechanism are also basically in a coplanar state and provide support for both side components of the display.

In addition, in a case that the hinge mechanism is in the first state, at least one of the plurality of second rotating components 230 supports the floating support component 300, so that when the hinge mechanism is in the unfolded state, the display can be stably supported on the floating support component 300, to improve a support effect of the hinge mechanism on the display. In addition, in a case that the hinge mechanism is in the first state, the elastic reset members 520 are in a compressed or stretched state, to squeeze the floating support components 300 and the second rotating components 230. As shown in FIG. 2, the elastic reset members 520 may be assembled between the floating support component 300 and the base 100 through abutment members 510 such as screws or the like, and the elastic reset members 520 are squeezed between the abutment members 510 and the base 100. For example, the abutment member 510 passes through the base 100 and is detachably fastened to the floating support component 300. The elastic reset member 520 may be clamped and elastically abutted between the base 100 and an end that is of the abutment member 510 and that faces away from the floating support component 300. In a case that the hinge mechanism is in the first state, the second rotating component 230 supports the floating support component 300, and compresses the elastic reset member 520.

In addition, in a case that the second rotating component 230 supports the floating support component 300, a distance between the floating support component 300 and the base 100 is far. A distance between an outer wall that is of the base 100 and that faces away from the rotation axis of the first rotating component and the floating support component 300 may be a first distance.

In a case that the hinge mechanism is in the second state, both the first connecting component 210 and the second connecting component 220 are located on a side that is of the base 100 and that faces the screen support side of the base 100. In addition, in a case that the hinge mechanism is in a second state, the second rotating component 230 avoids the floating support component 300, so that the floating support component 300 can move in a direction closer to the base 100 to reset under an elastic action of the elastic reset member 520. Therefore, the floating support component 300 can avoid the display and provide avoidance space for the display, to prevent a case in which the display is squeezed and damaged in a folding process. At the same time, a distance between the floating support component 300 and the base 100 decreases, so that a distance between the outer wall of the base 100 and the floating support component 300 is a second distance, and the second distance is less than the first distance.

As described above, in a case that the hinge mechanism is in the second state, both the first connecting component 210 and the second connecting component 220 connected to the screen support components are on the screen support side of the base 100. That is, the display and the screen support components are all on a same side of the base 100, so that the display is entirely wrapped by the screen support components and the hinge mechanism, and an "inward-folding" electronic device is formed.

This embodiment of this application discloses the hinge mechanism. Both the first connecting component 210 and the second connecting component 220 of the hinge mechanism can be fixedly connected to the screen support components of the electronic device, so that adjacent screen support components can form a connection relationship through the hinge mechanism. In addition, the first connecting component 210 can form a rotation fit relationship with the first rotating component on the base 100 through the second rotating component 230, and the second connecting component 220 forms a rotation fit relationship with at least another first rotating component on the base 100 through at least another second rotating component 230, so that when the adjacent screen support components move relative to each other, the first connecting component 210 and the second connecting component 220 can also move relative to each other, to enable the electronic device to have unfolding and folding capabilities.

In addition, the electronic device formed by using the hinge mechanism is an inward folding electronic device, and in a case that the electronic device is in a folded state, the screen support components and the hinge mechanism can provide a protection function for the display, to prevent friction or collision between the display and an external object. This can improve a service life of the display of the electronic device.

In addition, the floating support component 300 is disposed in the hinge mechanism, and the floating support component 300 forms a movable fit relationship with the base 100 through the plurality of elastic reset members 520. In a case that the hinge mechanism is in the first state, at least one second rotating component 230 can support the floating support component 300, and the elastic reset members 520 are in a stretched or compressed state, so that the floating support component 300 can provide reliable support for the display. In a case that the hinge mechanism is in the second state, the second rotating components 230 avoid the floating support component 300, and under an elastic action of the elastic reset members 520, the elastic reset members 520 may be moved in a direction closer to the base 100 to avoid the display, so as to prevent the display from being damaged due to squeeze.

In addition, two of the plurality of elastic reset members 520 disposed between the floating support component 300 and the base 100 are the first reset member and the second reset member. The first reset member is on one side of a midpoint of the base 100 in the direction of the rotation axis, the second reset member is on the other side of the midpoint of the base 100, and an angle between a connection line between the first reset member and the second reset member and the rotation axis is an acute angle, so that arrangement states of the first reset member and the second reset member are scattered. This can prevent deviation of the floating support component 300 in a process of moving relative to the base 100, and improve movement stability between the floating support component 300 and the base 100.

For example, the plurality of elastic reset members 520 are disposed in groups of two, and a connection line of two elastic reset members 520 in each group is parallel to the rotation axis. That is, in this embodiment of this application, there are at least four elastic reset members 520, and the four elastic reset members 520 are disposed in groups of two. One of the two groups of elastic reset members 520 includes the first reset member, and the other includes the second reset member. In a case that this technical solution is used, a quantity of action points (that is, the elastic reset members 520) between the floating support component 300 and the base 100 may be increased. In addition, connection stability provided by the plurality of elastic reset members 520 arranged in the foregoing relative position relationship is higher. This improves motion stability between the floating support component 300 and the base 100.

Four elastic reset members 520 are used as examples, so that a pattern formed by connection lines between the four elastic reset members 520 may be rectangular. In this case, distances between two elastic reset members 520 in different groups are equal. Certainly, distances between two elastic reset members 520 in different groups may also be unequal. In this technical solution, a pattern formed by connection lines between the four elastic reset members 520 may be another quadrilateral structure such as a trapezoid. Compared with a technical solution in which the plurality of elastic reset members 520 are arranged in a straight line, and a quantity of elastic reset members 520 is two or more, in a case that the foregoing technical solution disclosed in this embodiment is used, and an arrangement form of the elastic reset members 520 may greatly improve connection stability between the floating support component 300 and the base 100.

In addition, the quantity of elastic reset members 520 may also be another number more than four. Compared with a technical solution in which the elastic reset members 520 are arranged in a straight line, in a case that connection lines between the plurality of elastic reset members 520 can form a polygon with more than four sides, connection stability between the base 100 and the floating support component 300 can be basically improved.

For example, a distance between the first reset member and the midpoint of the base 100 may be the same as a distance between the second reset member and the midpoint of the base 100. That is, the first reset member and the second reset member are symmetrically disposed about the midpoint of the base 100. As described above, a connection line between the first reset member and the second reset member is inclined relative to the rotation axis. In a case that the technical solution disclosed in this embodiment of this application is used, positions of the first reset member and the second reset member may be symmetrically on the base 100, so that arrangement of action areas between the floating support component 300 and both the first reset member and the second reset member (and other two clastic reset members 520 in same groups as the first reset member and the second reset member) is more uniform and scattered, to improve motion stability between the floating support component 300 and the base 100.

As described above, in a case that the hinge mechanism is in the first state, at least one second rotating component 230 supports the floating support component 300, and stretches or compresses the clastic reset member 520. In a case that the hinge mechanism is in the first state, each second rotating component 230 supports the floating support component 300, and each elastic reset member is in a stretched or compressed state. In a case that the plurality of second rotating components 230 provide support for the floating support component 300 from opposite sides of the floating support component 300, both stability and reliability of the floating support component 300 are high during moving in a direction away from the base 100.

As described above, in a process of switching the hinge mechanism to the first state, the second rotating components 230 can contact the floating support component 300, and while providing support for the floating support component 300, the elastic reset members are forced to be compressed or stretched. That is, a direct source of elastic potential energy of the elastic reset members is the second rotating components 230. Based on this, to enable each clastic reset member to be stably stretched or compressed, and prevent deviation of the elastic reset members 520, optionally, a second rotating component 230 is disposed on each elastic reset member 520 in a one-to-one correspondence, so that any one of the plurality of second rotating components 230 can use acting force on a corresponding elastic reset member 520 in a more targeted manner.

For example, the elastic reset member 520 may be located near the second rotating component 230 corresponding to the elastic reset member 520. Therefore, a direct object of support force of the second rotating component 230 is the elastic reset member 520, and the clastic reset member 520 is stretched or compressed. Correspondingly, each elastic reset member 520 may be stretched or compressed in the common action of the plurality of second rotating components 230. For example, the second rotating components 230 may be the same in structure and size. In this case, distances between the elastic reset members 520 and corresponding second rotating components 230 may be equal, and an equivalent relative position between any elastic reset member 520 and second rotating component 230 that correspond to each other is the same or similar.

In another embodiment of this application, as shown in FIG. 1, a connection line between the elastic reset member 520 and the second rotating component 230 that correspond to each other is perpendicular to the rotation axis. Because positions of action points of the plurality of second rotating components 230 are different on the floating support component 300, in this case, a connection line between the second connecting component 220 and the elastic reset component 520 that correspond to each other in each group is perpendicular to the rotation axis, so that a connection line between the action points of the two is also perpendicular to the rotation axis. This can ensure that force on the floating support component 300 is more symmetrical, to improve stability of the floating support component 300.

Optionally, as shown in FIG. 1, in the plurality of second rotating components 230, an overall arrangement direction of one second rotating component 230 connected to the first connecting component 210 and another rotating component connected to the second connecting component 220 may be the direction of the rotation axis. In this case, a connection line between two elastic reset members 520 corresponding to the two second rotating components 230 and the rotation axis may form an acute angle, to prevent connection lines between the elastic reset members 520 from being parallel to the rotation axis. In a case that the overall arrangement direction of the two second rotating components 230 is a direction (that is, the direction B in FIG. 1) perpendicular to the rotation axis, a line connecting the two elastic reset members 520 corresponding to the two rotating components may be perpendicular to the rotation axis, to ensure high stability provided by the elastic reset members 520.

To enable the first connecting component 210 and the second connecting component 220 to rotate synchronously relative to the base 100, optionally, as shown in FIG. 1, the hinge mechanism disclosed in this embodiment of this application may further include a synchronization component. The synchronization component includes a first synchronization swing arm 410 and a second synchronization swing arm 420. The first synchronization swing arm 410 is connected to the first connecting component 210, to form a linkage relationship, so that the first connecting component 210 can drive the first synchronization swing arm 410 to rotate relative to the base 100. The second synchronization swing arm 420 is connected to the second connecting component 220, to form a linkage relationship, so that the second connecting component 220 can drive the second synchronization swing arm 420 to rotate relative to the base 100. When the first connecting component 210 and the second connecting component 220 move relative to each other, the first synchronization swing arm 410 and the second synchronization swing arm 420 can also rotate relative to each other. In addition, the first synchronization swing arm 410 and the second synchronization swing arm 420 are connected to each other through transmission. When acting force is applied to only one of the first connecting component 210 and the second connecting component 220, both the first connecting component 210 and the second connecting component 220 can rotate synchronously relative to the base 100 through transmission by the first synchronization swing arm 410 and the second synchronization swing arm 420.

A transmission connection relationship may be formed between the first synchronization swing arm 410 and the second synchronization swing arm 420 through meshing teeth, or a transmission connection relationship may be formed between the first synchronization swing arm 410 and the second synchronization swing arm 420 through another transmission member. In addition, to ensure a stable transmission fit relationship between the first synchronization swing arm 410 and the second synchronization swing arm 420, as shown in FIG. 1, both the first synchronization swing arm 410 and the second synchronization swing arm 420 may form rotation fit relationships with the base 100 through links 720, so that when the first synchronization swing arm 410 rotates relative to the base 100, the first synchronization swing arm 410 can stably drive the second synchronization swing arm 420 to rotate relative to the base 100. For example, both the first synchronization swing arm 410 and the second synchronization swing arm 420 may form stable rotation fit relationships with the base 100 through the links 720, and the two links 720 are spaced apart from each other in the direction perpendicular to the rotation axis. In a circumferential direction of the rotation axis of the first rotating component, both the first synchronization swing arm 410 and the second synchronization swing arm 420 may form rotation fit relationships with the corresponding links 720, or each link 720 may form a rotation fit relationship with the base 100.

As described above, the first synchronization swing arm 410 and the second synchronization swing arm 420 may form a transmission connection relationship through meshing teeth. Both the first synchronization swing arm 410 and the second synchronization swing arm 420 are provided with meshing teeth, both of which may be directly coupled through respective meshing teeth to form the transmission fit relationship.

To reduce diameters of reference circles of the meshing teeth of the first synchronization swing arm 410 and the second synchronization swing arm 420, in another embodiment of this application, as shown in FIG. 1, the hinge mechanism may further include a first gear 451 and a second gear 452 that mesh with each other. The first gear 451 and the second gear 452 may provide a bridging function for the transmission connection relationship between the first synchronization swing arm 410 and the second synchronization swing arm 420, to reduce the diameters of the reference circles of the meshing teeth of the first synchronization swing arm 410 and the second synchronization swing arm 420, reduce sizes of corresponding parts of the first synchronization swing arm 410 and the second synchronization swing arm 420, and reduce a size of the hinge mechanism in the direction perpendicular to the rotation axis of the first rotating component.

Certainly, to ensure motion stability of the first gear 451 and the second gear 452, gear shafts may be disposed for both the first gear 451 and the second gear 452, so that the gear shafts are mounted on gear holes of the base 100, to provide support for the first gear 451 and the second gear 452. Correspondingly, a rotation fit relationship needs to be formed between a gear shaft and one of the first gear 451 and the base 100, and a rotation fit relationship also needs to be formed between the gear shaft corresponding to the second gear 452 and the base 100 or the second gear 452.

In this embodiment, peripheral walls of the first synchronization swing arm 410 and the second synchronization swing arm 420 may be processed to form meshing teeth. In another embodiment of this application, a mating gear may be further installed on the link 720, and the mating gear and the first synchronization swing arm 410 are relatively fixed in a circumferential direction of the rotation axis, to drive the mating gear to rotate in a rotating process of the first synchronization swing arm 410. The first synchronization swing arm 410 and the first gear 451 may also form a transmission connection relationship through the transmission connection between the mating gear and the first gear 451.

In a case that this technical solution is used, a gear standard part may be directly used as the meshing teeth of the first synchronization swing arm 410, and therefore, the meshing teeth do not need to be additionally processed on the peripheral wall of the first synchronization swing arm 410, to greatly reduce overall processing difficulty of the hinge mechanism. Similarly, the second synchronization swing arm 420 may also be provided with a mating gear, and the mating gear is meshed with the second gear 452, so that the second synchronization swing arm 420 may also form a transmission connection relationship with the second gear 452 through the mating gear.

In the foregoing embodiment, the first synchronization swing arm 410 and the corresponding mating gear are used as an example, a relatively fixed relationship may be formed between the first synchronization swing arm 410 and the corresponding mating gear in the circumferential direction of the rotation axis through welding. Considering later maintenance of the hinge mechanism, the first synchronization swing arm 410 and the corresponding link 720 may be relatively fixed in the circumferential direction of the rotation axis of the first rotating component, and the mating gear and the link 720 are also relatively fixed in the foregoing direction. In this case, it can be ensured that the first synchronization swing arm 410 and the mating gear can form a relatively fixed relationship within the foregoing circumferential direction through the link 720. Similarly, the second synchronization swing arm 420 and the corresponding mating gear can also form a relatively fixed relationship in the foregoing circumferential direction according to the foregoing technical solution.

In the foregoing embodiment, the link 720 and the first synchronization swing arm 410 may fit with each other through a key connection, so that the link 720 rotates relative to the base 100 with the first synchronization swing arm 410. In a process of assembling the link 720 and the base 100, a position limiting structure may be disposed on the base 100, and the first gear 451 and the second gear 452 can be limited in the foregoing position limiting structure, so that both the first gear 451 and the second gear 452 form stable relatively fixed relationships with the base 100 in the direction of the rotation axis.

As described above, both the first synchronization swing arm 410 and the second synchronization swing arm 420 may be provided with mating gears, and both the first gear 451 and the second gear 452 form transmission fit relationships with the mating gears. For example, a mating gear disposed at one end of the link 720 that fits with the first synchronization swing arm 410 may be a third gear, and a mating gear disposed at one end of the link 720 that fits with the second synchronization swing arm 420 may be a fourth gear. Considering that the first synchronization swing arm 410 and the second synchronization swing arm 420 are basically in a symmetrical structure, the following describes the first synchronization swing arm 410. The third gear, the link 720, and the first synchronization swing arm 410 may be relatively fixed through key connection in the circumferential direction of the rotation axis, to ensure that the third gear and the first synchronization swing arm 410 can rotate synchronously.

The base 100 may be provided with the position limiting structure. The position limiting structure may include a position limiting groove. In a process of assembling the first gear 451, the second gear 452, and the base 100, both the first gear 451 and the second gear 452 may be installed in the position limiting groove, and the position limiting groove provides a position limiting function for the first gear 451 and the second gear 452 in the direction of the rotation axis. In addition, a gear hole may be formed on a sidewall of the position limiting groove through processing, one end of the gear shaft is disposed on the first gear 451 (or the second gear 452) through the gear hole, and is finally inserted into another sidewall of the position limiting groove, to provide support for the first gear 451.

In another embodiment of this application, as shown in the figure, the first gear 451 and the gear shaft are an integrated structural member. In this case, connection reliability between the first gear 451 and the gear shaft can be improved, to ensure stability of a linkage process between the first gear 451 and the first synchronization swing arm 410. In this embodiment, a size of the position limiting groove may be designed, so that the position limiting groove does not produce a limiting effect on the gear shaft while providing a limiting effect for the first gear 451.

As described above, the first synchronization swing arm 410 and the second synchronization swing arm 420 are respectively connected to the first connecting component 210 and the second connecting component 220. Because rotation axes of the first synchronization swing arm 410 and the corresponding first rotating component are different, in a process in which the first synchronization swing arm 410 rotates with the first connecting component 210 on the axis of the first rotating component, the first synchronization swing arm 410 and the first connecting component 210 move relative to each other. Based on this, the first synchronization swing arm 410 and the first connecting component 210 may form a sliding fit relationship. As shown in FIG. 1 and FIG. 4, the first synchronization swing arm 410 and the first connecting component 210 may form a sliding connection relationship through a sliding sleeve 240 and a pin shaft 710 that are slidably fitted. The sliding sleeve 240 is provided with a track, and the pin shaft 710 is inserted into the sliding sleeve 240 and moves relative to the sliding sleeve 240 along the track.

To prevent adversely affecting a transmission connection relationship between the first synchronization swing arm 410 and the first gear 451 (or the second synchronization swing arm 420) because the first synchronization swing arm 410 and the link 720 move relative to each other in a direction of a rotation axis, optionally, the hinge mechanism disclosed in this embodiment of this application may further include a hovering elastic member. In the direction of the rotation axis of the first rotating component, the hovering elastic member is connected between the base 100 and the first synchronization swing arm 410, so that the first synchronization swing arm 410 and the base 100 form a squeeze fit relationship by using the hovering elastic member in the direction of the rotation axis of the first rotating component. This limits autonomous rotation of the first synchronization swing arm 410, so that the hinge mechanism has a sense of damping. In addition, under the action of the hovering elastic member, the first synchronization swing arm 410 may be prevented from moving relative to the base 100 in the direction of the rotation axis.

For example, a direct connection relationship such as abutment or fixed connection may be formed between the hovering elastic member and the first synchronization swing arm 410, or the two may be indirectly connected together through another structural member, so that clastic force of the hovering elastic member can be applied to the first synchronization swing arm 410. The hovering elastic member is always in a compressed or stretched state, so that the first synchronization swing arm 410 can be squeezed onto the base 100 regardless of an unfolding angle of the hinge mechanism, and the first synchronization swing arm 410 always has a sense of damping. Alternatively, another structural component may be added, and only when the hinge mechanism is in a range of some angles, the first synchronization swing arm 410 and the base 100 are squeezed against each other, and when the hinge mechanism is in a range of other angles, the first synchronization swing arm 410 and the base 100 are basically not squeezed against each other.

For example, the hovering elastic member is in a stretched or compressed state, to squeeze the first synchronization swing arm 410 and a surface that is of the base 100 and that is in contact with the first synchronization swing arm 410. In this embodiment, a notch may be disposed on the base 100, and both the first synchronization swing arm 410 and the hovering clastic member are disposed in the notch, so that a first side wall that is of the notch of the base 100 and that faces the first synchronization swing arm 410 is in contact with the first synchronization swing arm 410, and two ends of the hovering elastic member are abutted against the first synchronization swing arm 410 and a second side wall of the notch of the base 100. The second side wall and the first side wall are disposed opposite to each other in the direction of the rotation axis. Certainly, there are a plurality of combinations of setting positions and connection forms of the hovering elastic member, which are not described one by one herein.

In another embodiment of this application, the hinge mechanism includes a hovering elastic member, a position limiting member 430, and a positioning member, to form a damping component 440. The positioning member may be a flat structural member, and the positioning member and the base 100 are disposed at intervals and fixed in a direction of a rotation axis. The positioning member and the base 100 may be formed in an integrated manner, to improve connection reliability of the positioning member and the base 100. For example, an opening groove may be disposed on the base 100, and the positioning member is opposite to an opening of the opening groove. Based on this, both the hovering elastic member and the first synchronization swing arm 410 may be disposed between the opening groove of the base 100 and the positioning member, and the position limiting member 430 may be disposed between the first synchronization swing arm 410 and the positioning member.

In addition, a plurality of first position limiting protrusions disposed at intervals along a circumferential direction (that is, a direction around the rotation axis) of the rotation axis are disposed at one end that is of the position limiting member 430 and that faces the first synchronization swing arm 410. Correspondingly, a plurality of second position limiting protrusions disposed at intervals along the circumferential direction of the rotation axis are disposed at one end that is of the first synchronization swing arm 410 and that faces the position limiting member 430.

Any one of the plurality of first position limiting protrusions may be clamped in a gap between any two adjacent ones of the plurality of second position limiting protrusions, and any one of the plurality of second position limiting protrusions may be clamped in a gap between any two adjacent ones of the plurality of first position limiting protrusions. Therefore, in a process in which the first synchronization swing arm 410 and the position limiting member 430 rotate relative to each other along the circumferential direction of the rotation axis, the first position limiting protrusions and the second position limiting protrusions may not only enable the position limiting member 430 and the first synchronization swing arm 410 to rotatably fit in the circumferential direction of the rotation axis, but also enable the position limiting member 430 and the first synchronization swing arm 410 to movably fit in the direction of the rotation axis. The movable fit is reciprocating moving along the direction of the rotation axis.

In the foregoing embodiment, one of the position limiting member 430 and the first synchronization swing arm 410 may be connected to one end of the hovering elastic member, and one of the base 100 and the positioning member may be connected to the other end of the hovering clastic member. According to a case of the component connected to the hovering clastic member, a compressed or stretched state of the hovering elastic member is correspondingly set. In other words, the position limiting member 430 and the first synchronization swing arm 410 may be in a squeezed state in the direction of the rotation axis of the first rotating component. As described above, in a case that the position limiting member 430 is located between the first synchronization swing arm 410 and the positioning member, opposite ends of the hovering clastic member may abut between the position limiting member 430 and the positioning member.

When a first position limiting protrusion is located between two adjacent second position limiting protrusions, and two opposite sides of the first position limiting protrusion are in contact with the two second position limiting protrusions on opposite sides of the first position limiting protrusion. In this fit state, the hovering elastic member may be in a natural state. In addition, a state other than the foregoing fit state may make the hovering clastic member in the stretched or compressed state, to ensure that the hovering elastic member has a tendency of making the first position limiting protrusion and the second position limiting protrusions in the foregoing fit state, and a tendency to transition to the foregoing fit state.

In a case that the foregoing technical solution is used, if the first synchronization swing arm 410 and the position limiting member 430 are not subjected to external force, the hinge mechanism can be stably in a state of at least one specific angle. Certainly, in a process of designing a structure of the first position limiting protrusions and the second position limiting protrusions, it needs to be ensured that when the hinge mechanism is in the unfolded state and the folded state, the first position limiting protrusion and the second position limiting protrusion can be in the foregoing fit state, so that the hinge mechanism can stably hover in the unfolded state, the folded state, and at least another angle between the unfolded state and the folded state, to expand use scenarios of the electronic device and improve user experience.

As described above, in a case that the hinge mechanism is in the second state, each of the first connecting component 210 and the second connecting component 220 is located on a side that is of the base 100 and that faces the screen support side of the base 100. That is, the hinge mechanism is applicable to an inward folding electronic device. When such an electronic device is in a folded state, the hinge mechanism needs to provide accommodation space for the display, to ensure that the display is not squeezed by relatively moving parts in the hinge mechanism.

In addition, in the foregoing embodiment, the floating support component 300 that has a capability of moving relative to the base 100 is disposed, to provide an avoidance function for the display. In addition, the floating support component 300 may further provide certain support for a middle part of the display. Certainly, to improve a supported effect of the part that is of the display and that corresponds to the hinge mechanism, optionally, the hinge mechanism disclosed in this embodiment of this application may further include support plates 600. Both the first connecting component 210 and the second connecting component 220 are connected to the support plates 600, and both the first connecting component 210 and the second connecting component 220 are configured to drive the corresponding support plates 600 to rotate relative to the base 100.

In a case that the foregoing technical solution is used, and in a case that the hinge mechanism is in the first state, the support plates 600 corresponding to the first connecting component 210 and the second connecting component 220 may provide support for corresponding regions of the display, so that the component that is of the display and that corresponds to the hinge mechanism can be basically supported by the support plates 600 and the floating support component 300 together, to improve an overall support effect of the display, and improve a display effect and a service life of the display.

For example, a fixed connection relationship may be formed between the first connecting component 210 (and the second connecting component 220) and the corresponding support plate 600, so that the support plate 600 can provide reliable support for the display. In addition, a size and shape of the support plate 600 may be correspondingly determined based on parameters such as a shape and a size of another component in the hinge mechanism, and are not limited herein.

In a case that the hinge mechanism disclosed in this embodiment of this application includes the support plates 600, to provide avoidance space for the display, for example, the first connecting component 210 and the corresponding support plate 600 may form a rotation connection relationship, so that the first connecting component 210 and the corresponding support plate 600 have a relative rotation capability. Certainly, the second connecting component 220 and the first connecting component 210 are basically in a symmetrical structure. For a fit relationship between the second connecting component 220 and the corresponding support plate 600, refer to the first connecting component 210.

In a case that the first connecting component 210 and the support plate 600 have a relative rotation capability, to ensure that the support plate 600 can rotate relative to the first connecting component 210, the base 100 may be provided with a first hinge component, the first connecting component 210 may be provided with a second hinge component 250, and the support plate 600 is provided with a third hinge component and a fourth hinge component. In addition, the first hinge component is rotatably connected to the third hinge component, and the second hinge component 250 is rotatably connected to the fourth hinge component.

In this case, rotation axes of the first hinge component, the second hinge component 250, the second rotating component 230, and the like may be designed, so that the support plate 600 has a capability of rotating relative to the first connecting component 210. In more details, the rotation axis of the third hinge component may be located on a side that is of the rotation axis of the second connecting component 220 and that faces away from the second rotating component 230, so that in a process in which the first connecting component 210 rotates relative to the base 100 by using the rotation axis of the second rotating component 230, the support plate 600 can rotate relative to the base 100 by using the rotation axis of the second rotating component 230 as a virtual axis. In addition, because of a connection between the first hinge component and the third hinge component, the first hinge component can move in a track of the third hinge component, so that the support plate 600 has a capability of rotating relative to the first connecting component 210. Certainly, a person skilled in the art may also use another technical means to enable the support plate 600 to rotate relative to the first connecting component 210. For example, the display squeezes the support plate 600, so that the support plate 600 can also rotate in a direction close to the first connecting component 210, to avoid contact with the display.

In a case that the first connecting component 210 and the support plate 600 have a relative rotation capability, in a case that the hinge mechanism is in the first state, the support plates 600 are supported on the base 100, and first surfaces that are of the support plates 600 and that face away from the base 100 are coplanar, so that a support component that rotates relative to the first connecting component 210 (and the second connecting component 220) can provide reliable support for a corresponding part of the display by supporting on the base 100.

Certainly, in the foregoing state, there are gaps between ends that are of the two adjacent support plates 600 and that are adjacent to each other and corresponding first connecting component 210 (and the second connecting component 220), to ensure that in a process in which the hinge mechanism switches from the first state to the second state, the first connecting component 210 can rotate relative to the corresponding support plates 600, so that an angle of relative rotation between the two adjacent support plates 600 is greater than an angle of relative rotation between the first connecting component 210 and the second connecting component 220, to provide avoidance space for the display by using a flaring function of the support plate 600, and avoid damage to the display due to squeezing by the support plate 600 in the folding process and in the folded state.

Correspondingly, in a case that the hinge mechanism is in the second state, both the first connecting component 210 and the second connecting component 220 support the respective support plates 600. The support plate 600 corresponding to the first connecting component 210 is supported on the first connecting component 210, and the support plate 600 corresponding to the second connecting component 220 is supported on the second connecting component 220, so that first surfaces of the two opposing support plates 600 form a flared structure, and the flare faces the base 100.

When the hinge mechanism is in the first state, first surfaces that are of two adjacent support plates 600 and that support the display are coplanar. With relative rotation between the first connecting component 210 and the second connecting component 220, the first connecting component 210 and the corresponding support plate 600 can also rotate relative to each other, and the second connecting component 220 and the corresponding support plate 600 can rotate relative to each other, so that angles of rotation of the two adjacent support plates 600 can exceed 90°. Therefore, a distance between sides that are of the two adjacent support plates 600 and that close to the base 100 is greater than a distance between sides that are of the two adjacent support plates 600 and that are away from the base 100, so that the two support plates 600 form the flared structure, and the flare faces the base 100.

In a case that the foregoing technical solution is used, the support plate 600 of the hinge mechanism that switches to the second state can move in a direction away from the display, to provide an avoidance function for the display, so that the display is basically not squeezed by the support plate 600 (or the entire hinge mechanism) in the folding process or in the folded state.

For example, both the first connecting component 210 and the second connecting component 220 are provided with inclined surfaces on sides facing the support plate 600, so that in an operating process of the hinge mechanism, the support plate 600 can rotate at a preset angle relative to the first connecting component 210, and is supported on the first connecting component 210.

In an embodiment of this application, the hinge mechanism includes linkage members 200. There are a plurality of linkage members 200, and each linkage member 200 includes the second rotating component 230. At least one of the plurality of linkage members 200 includes the first connecting component 210, and at least another one of the plurality of linkage members 200 includes the second connecting component 220. In addition, the linkage member 200 is an integrated structural member. Connection reliability between the second rotating component 230 and the connecting component can be improved. In addition, difficulty in assembling the second rotating member and the first connecting component 210 (or the second connecting component 220) with another component in the hinge mechanism can be reduced.

According to the hinge mechanism disclosed in any one of the foregoing embodiments, this application further discloses an electronic device. The electronic device includes a display, screen support components, and the hinge mechanism disclosed in any one of the foregoing embodiments. Both the first connecting component 210 and the second connecting component 220 are connected to the screen support components. In other words, there are at least two screen support components. In addition, the display is located on a screen support side of the base 100 in the hinge mechanism, and the display is supported on the floating support component 300 of the hinge mechanism and the screen support components. For example, a part that is of the display and that corresponds to the screen support components is supported on the screen support components, and a part that is of the display and that corresponds to the hinge mechanism is supported at least on the floating support component 300 of the hinge mechanism. In the electronic device formed according to the foregoing hinge mechanism, in a case that the hinge mechanism is in the second state, the display is surrounded by the hinge mechanism and the screen support components, so that the electronic device forms an inward folding electronic device. When the electronic device is in a folded state, the display may be protected by the screen support components and the hinge mechanism, to avoid easy friction or collision between the display and an external object, and improve a service life of the display.

It should be noted that the terms “include”, “comprise”, or any other variation thereof in this specification is intended to cover a non-exclusive inclusion, which specifies the presence of stated processes, methods, objects, or apparatuses, but do not preclude the presence or addition of one or more other processes, methods, objects, or apparatuses. Without more limitations, elements defined by the sentence “including one” do not exclude that there are still other same elements in the processes, methods, objects, or apparatuses. In addition, it should be noted that the scope of the method and apparatus in embodiments of this application is not limited to performing a function in a sequence shown or discussed, and may further include performing a function in a basically simultaneous manner or in a reverse sequence according to a function involved. For example, the described method may be performed in a different order, and various steps may be added, omitted, or combined. In addition, features described with reference to some examples may also be combined in other examples.

Embodiments of this application have been described above with reference to the accompanying drawings. This application is not limited to the embodiments described above, and the embodiments described above are merely examples and not limitative. Those of ordinary skill in the art may make various variations under the teaching of this application without departing from the purpose of this application and the protection scope of the claims, and such variations shall all fall within the protection scope of this application.

What is claimed is:

1. A hinge mechanism, wherein the hinge mechanism comprises a base, first rotating components, second rotating components, a first connecting component, a second connecting component, a floating support component, and elastic reset members;

there are a plurality of first rotating components and a plurality of second rotating components, the plurality of the first rotating components are disposed on the base, and the plurality of the second rotating components are rotatably connected to the plurality of the first rotating components in a one-to-one correspondence;

both the first connecting component and the second connecting component are fixedly connected to screen support components of an electronic device, at least one of the plurality of the second rotating components is fixedly connected to the first connecting component, and at least another one of the plurality of the second rotating components is fixedly connected to the second connecting component;

the floating support component is disposed on a side of the base that faces a screen support side of the base, and the floating support component is movably connected to the base along an arrangement direction of the floating support component and the base;

there are a plurality of elastic reset members, the elastic reset members are connected between the floating support component and the base, the plurality of the elastic reset members comprise a first reset member and a second reset member, the first reset member is on one side of a midpoint of the base in a direction of a rotation axis of the first rotating components, the second reset member is on another side of the midpoint of the base, and an angle between a connection line between the first reset member and the second reset member and the rotation axis is an acute angle; and the hinge mechanism has a first state and a second state, and in a case that the hinge mechanism is in the first state, the first connecting component is on one side of the base, the second connecting component is on another side of the base, at least one of the plurality of the second rotating components supports the floating support component, the elastic reset members are in a compressed state to squeeze the floating support component and the second rotating components, and a distance between an outer wall of the base that faces away from the rotation axis of the first rotating components and the floating support component is a first distance; and in a case that the hinge mechanism is in the second state, both the first connecting component and the second connecting component are on a side that is of the base that faces the rotation axis of the first rotating components, the second rotating components avoid the floating support component, a distance between the outer wall of the base and the floating support component is a second distance, and the second distance is less than the first distance.

2. The hinge mechanism according to claim 1, wherein the plurality of the elastic reset members are disposed in groups of two, and a connection line between two elastic reset members in each group is parallel to the rotation axis.

3. The hinge mechanism according to claim 2, wherein a distance between the first reset member and the midpoint of the base is a same as a distance between the second reset member and the midpoint of the base.

4. The hinge mechanism according to claim 3, wherein each elastic reset member corresponds to a second rotating component of the second rotating components, and a connection line between the elastic reset member and the corresponding second rotating component is perpendicular to the rotation axis.

5. The hinge mechanism according to claim 1, wherein the hinge mechanism further comprises a synchronization component, the synchronization component comprises a first synchronization swing arm and a second synchronization swing arm, the first synchronization swing arm and the second synchronization swing arm each are rotatably connected to the base through a link, and the first synchronization swing arm is connected to the second synchronization swing arm through transmission; the first synchronization swing arm is connected to the first connecting component, and the first connecting component is configured to drive the first synchronization swing arm to rotate relative to the base; and the second synchronization swing arm is connected to the second connecting component, and the second connecting component is configured to drive the second synchronization swing arm to rotate relative to the base.

6. The hinge mechanism according to claim 1, wherein the hinge mechanism comprises linkage members, the linkage member is an integrated structural member, each linkage member comprises one of the second rotating components, at least one of the plurality of the linkage members comprises the first connecting component, and at least another one of the plurality of the linkage members comprises the second connecting component.

7. The hinge mechanism according to claim 1, wherein the hinge mechanism further comprises support plates, and both the first connecting component and the second connecting component are rotatably connected to the support plates; and in a case that the hinge mechanism is in the first state, first surfaces of the support plates that face away from the base are coplanar, two opposing support plates are supported on the base, and in a case that the hinge mechanism is in the second state, the first connecting component and the second connecting component each support corresponding support plates, the first surfaces of the two support plates form a flared structure, and the flare faces the base.

8. An electronic device, comprising a display, screen support components, and a hinge mechanism, wherein the hinge mechanism comprises a base, first rotating components, second rotating components, a first connecting component, a second connecting component, a floating support component, and elastic reset members;

there are a plurality of first rotating components and a plurality of second rotating components, the plurality of the first rotating components are disposed on the base, and the plurality of the second rotating components are rotatably connected to the plurality of the first rotating components in a one-to-one correspondence;

both the first connecting component and the second connecting component are fixedly connected to the screen support components of the electronic device, at least one of the plurality of the second rotating components is fixedly connected to the first connecting component, and at least another one of the plurality of the second rotating components is fixedly connected to the second connecting component;

the floating support component is disposed on a side of the base that faces a screen support side of the base, and the floating support component is movably connected to the base along an arrangement direction of the floating support component and the base;

there are a plurality of elastic reset members, the elastic reset members are connected between the floating support component and the base, the plurality of the elastic reset members comprise a first reset member and a second reset member, the first reset member is on one side of a midpoint of the base in a direction of a rotation axis of the first rotating components, the second reset member is on another side of the midpoint of the base, and an angle between a connection line between the first reset member and the second reset member and the rotation axis is an acute angle; and the hinge mechanism has a first state and a second state, and in a case that the hinge mechanism is in the first state, the first connecting component is on one side of the base, the second connecting component is on another side of the base, at least one of the plurality of the second rotating components supports the floating support component, the elastic reset members are in a compressed state to squeeze the floating support component and the second rotating components, and a distance between an outer wall of the base that faces away from the rotation axis of the first rotating components and the floating support component is a first distance; and in a case that the hinge mechanism is in the second state, both the first connecting component and the second connecting component are on a side of the base that faces the rotation axis of the first rotating components, the second rotating components avoid the floating support component, a distance between the outer wall of the base and the floating support component is a second distance, and the second distance is less than the first distance;

wherein both the first connecting component and the second connecting component are connected to the screen support components, and the display is supported on the floating support component of the hinge mechanism and the screen support components.

9. The electronic device according to claim 8, wherein the plurality of the elastic reset members are disposed in groups of two, and a connection line between two elastic reset members in each group is parallel to the rotation axis.

10. The electronic device according to claim 9, wherein a distance between the first reset member and the midpoint of the base is a same as a distance between the second reset member and the midpoint of the base.

11. The electronic device according to claim 10, wherein each elastic reset member corresponds to a second rotating component of the second rotating components, and a connection line between the elastic reset member and the corresponding second rotating component is perpendicular to the rotation axis.

12. The electronic device according to claim 8, wherein the hinge mechanism further comprises a synchronization component, the synchronization component comprises a first synchronization swing arm and a second synchronization swing arm, the first synchronization swing arm and the second synchronization swing arm each are rotatably connected to the base through a link, and the first synchronization swing arm is connected to the second synchronization swing arm through transmission; the first synchronization swing arm is connected to the first connecting component, and the first connecting component is configured to drive the first synchronization swing arm to rotate relative to the base; and the second synchronization swing arm is connected to the second connecting component, and the second connecting component is configured to drive the second synchronization swing arm to rotate relative to the base.

13. The electronic device according to claim 8, wherein the hinge mechanism comprises linkage members, the linkage member is an integrated structural member, each linkage member comprises one of the second rotating components, at least one of the plurality of the linkage members comprises the first connecting component, and at least another one of the plurality of the linkage members comprises the second connecting component.

14. The electronic device according to claim 8, wherein the hinge mechanism further comprises support plates, and both the first connecting component and the second connecting component are rotatably connected to the support plates; and in a case that the hinge mechanism is in the first state, first surfaces of the support plates that face away from the base are coplanar, two opposing support plates are supported on the base, and in a case that the hinge mechanism is in the second state, the first connecting component and the second connecting component each support corresponding support plates, the first surfaces of the two support plates form a flared structure, and the flare faces the base.

* * * * *